United States Patent
Tang et al.

(10) Patent No.: US 12,463,632 B2
(45) Date of Patent: Nov. 4, 2025

(54) INTEGRATED CIRCUIT FOR GATE OVERVOLTAGE PROTECTION OF POWER DEVICES

(71) Applicant: Efficient Power Conversion Corporation, El Segundo, CA (US)

(72) Inventors: Zhikai Tang, Sunnyvale, CA (US); Edward Lee, Fullerton, CA (US); Jianjun Cao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 145 days.

(21) Appl. No.: 18/398,302

(22) Filed: Dec. 28, 2023

(65) Prior Publication Data

US 2024/0223178 A1   Jul. 4, 2024

Related U.S. Application Data

(60) Provisional application No. 63/477,502, filed on Dec. 28, 2022.

(51) Int. Cl.
*H03K 17/081*  (2006.01)

(52) U.S. Cl.
CPC ............... *H03K 17/08104* (2013.01)

(58) Field of Classification Search
CPC ......... H03K 17/08104; H03K 17/6877; H03K 17/0822

USPC .................................................. 361/56, 91.1
See application file for complete search history.

(56) References Cited

U.S. PATENT DOCUMENTS

| | | | |
|---|---|---|---|
| 5,172,290 A | 12/1992 | Leipold et al. | |
| 2011/0148376 A1* | 6/2011 | Xu | H03K 17/165 327/434 |
| 2016/0372920 A1 | 12/2016 | Kinzer et al. | |
| 2019/0214980 A1* | 7/2019 | Kim | G01R 31/2621 |
| 2022/0069735 A1* | 3/2022 | Kumazawa | H02M 7/521 |
| 2022/0182052 A1* | 6/2022 | Heckroth | H02P 27/08 |
| 2023/0170882 A1* | 6/2023 | Shah | H03K 17/102 327/143 |

FOREIGN PATENT DOCUMENTS

| | | | |
|---|---|---|---|
| EP | 0 523 800 A1 | 1/1993 | |
| EP | 3444949 A1 * | 2/2019 | ....... H03K 17/08104 |

* cited by examiner

*Primary Examiner* — Dharti H Patel
(74) *Attorney, Agent, or Firm* — Blank Rome LLP

(57) ABSTRACT

An integrated gate overvoltage protection circuit for protecting the gate of a main field effect transistor (FET). The gate protection circuit includes a blocking FET and a discharge FET connected between the gate and the drain of the main FET. The gate overvoltage protection circuit is configured to turn on both the first FET and the second FET in the event of a fault condition, such that charge from the gate of the main FET is discharged through the first FET and the second FET to the drain of the main FET, thereby protecting the gate of the main FET.

15 Claims, 14 Drawing Sheets

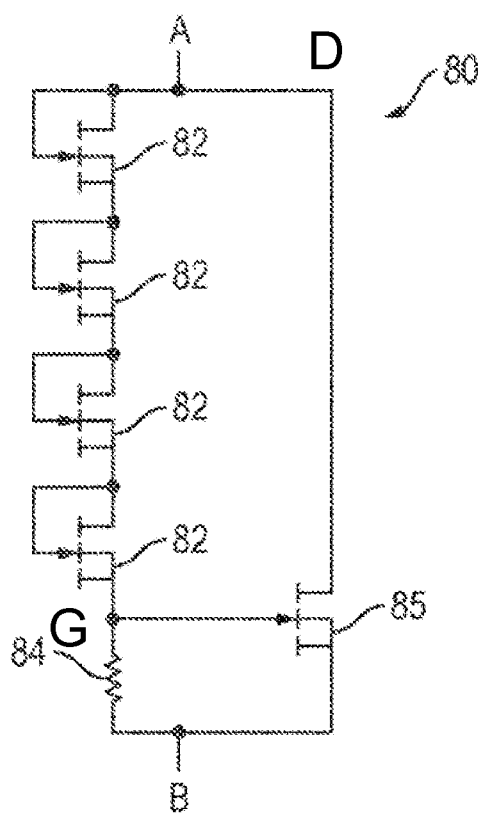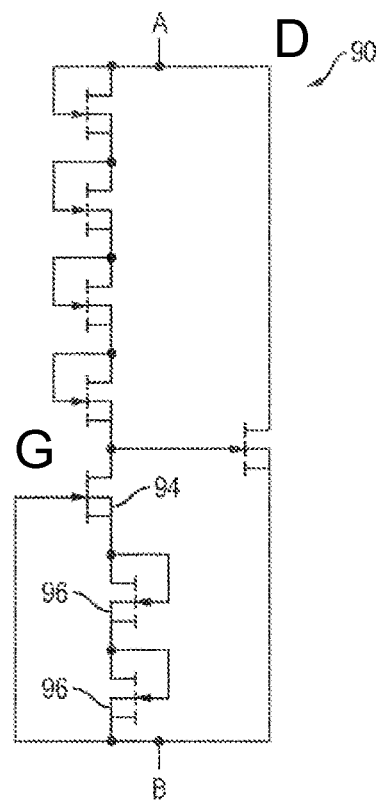
FIG. 2A
PRIOR ART
FIG. 2B
PRIOR ART

INTEGRATED CIRCUIT FOR GATE OVERVOLTAGE PROTECTION OF POWER DEVICES

CROSS-REFERENCE TO RELATED APPLICATION

This application claims the benefit of U.S. Provisional Application No. 63/477,502, filed Dec. 28, 2022, the disclosure of which is incorporated by reference herein in its entirety.

BACKGROUND OF THE INVENTION

1. Field of the Invention

The present invention relates generally to integrated (IC) circuits for gate overvoltage protection in power devices.

2. Description of the Related Art

Overvoltage protection circuits prevent damage to electrical components, such as transistors. For example, back-to-back Zener diodes are used to protect silicon MOSFETs and Field Effect Transistors (FETs) from overvoltage. FIG. 1, from U.S. Pat. No. 5,172,290, shows such a conventional overvoltage protection circuit. In FIG. 1, two Zener diodes 3 and 4 are connected back-to-back between the gate terminal G and the source terminal S of a power MOSFET 1. Zener diodes 3 and 4 protect the gate of MOSFET 1 against excessive positive and negative voltages.

However, the simple protection circuit of FIG. 1 has undesirable parasitic inductance, and a more integrated solution, which saves PCB area, is desired.

In other prior art protection circuits, a series connected stack of gate-drain connected FETs (effectively diodes) is coupled to the drain of a gallium nitride (GaN) FET for overvoltage protection. FIGS. 2A and 2B, from U.S. Patent Publication No. 2016/0372920, show such a circuit. Protection circuit 80 includes an enhancement mode GaN FET transistor 85 connected between nodes A and B. When the voltage at node A is greater than the sum of the voltage thresholds of the diode-connected transistors 82 higher than the voltage at node B, the diode connected transistors 82 conduct current from node A to node B through A resistor 84. As a result, the gate voltage of the enhancement mode GaN FET transistor 85 rises, and GaN FET transistor 85 conducts current from node A to node B, reducing and clamping the voltage difference between nodes A and B to be about equal to the sum of the voltage thresholds of the transistors 82. FIG. 2B shows a similar protection circuit 90 that includes a depletion mode GaN transistor 94 cascaded with diode-connected enhancement mode GaN transistors 96, in place of resistor 84 of FIG. 2A.

However, the circuits of FIGS. 1, 2A and 2B may have non-zero leakage current (IGS in FIG. 1) flowing though the diodes in FIG. 1 or the diode-connected transistors in FIGS. 2A and 2B. As a result, the driver that drives the gate of the main FET (i.e., FET 1 in FIG. 1) is required to supply this non-zero leakage current. In many cases, this may present some challenges to the design of the driver, which is usually required to generate a high turn-on voltages to drive the gate of the main FET.

Accordingly, it would be desirable to provide an integrated gate protection circuit without the above-noted deficiencies.

SUMMARY OF THE INVENTION

The present invention addresses the above-noted disadvantages of prior art protection circuits by providing an integrated gate protection circuit for protecting the gate of a main FET from voltage stresses due to a fault condition.

Advantageously, the circuit of the present invention provides gate overvoltage protection up to at least 25 V, which is considerably higher than the gate voltage rating of 5 V or 6 V of a typical GaN FET power transistor.

In a preferred embodiment, the gate protection circuit of the present invention is provided as an integrated circuit for protecting the gate of a main field effect transistor (FET), such as a bidirectional GaN FET. The gate protection circuit includes a blocking FET and a discharge FET connected between the gate and the drain of the main FET. The gate overvoltage protection circuit is configured to turn on both the first FET and the second FET in the event of a fault condition, such that charge from the gate of the main FET is discharged through the first FET and the second FET to the drain of the main FET, thereby protecting the gate of the main FET.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings, in which like reference characters identify correspondingly throughout and wherein:

FIGS. 2A and 2B show circuits using a series of gate-to-drain connected diodes in conventional overvoltage protection circuits.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 1:
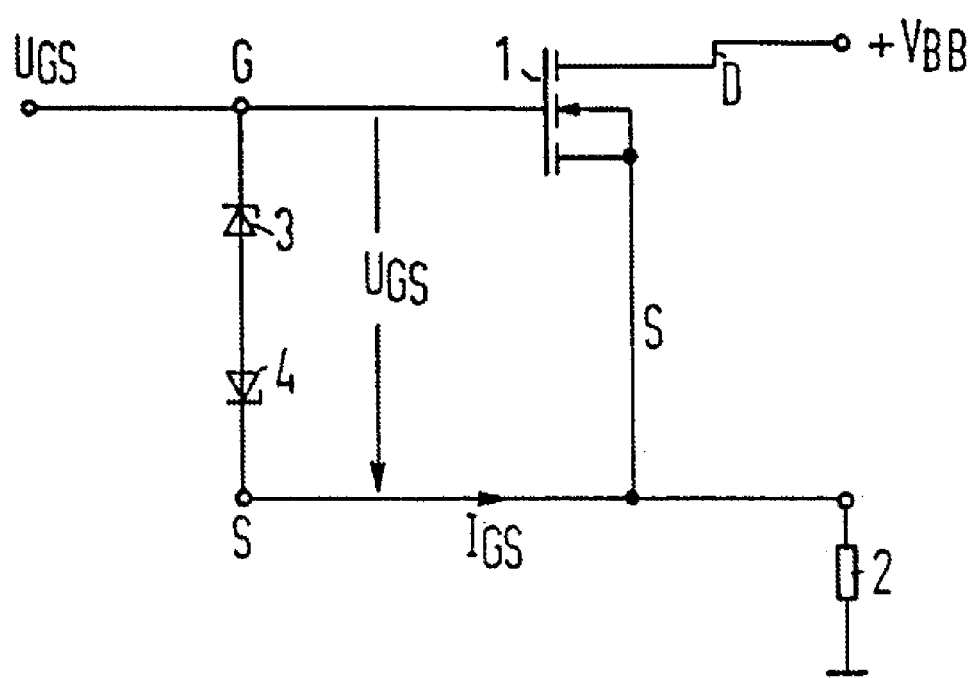
FIG. 1 shows a conventional gate overvoltage protection circuit using back-to-back Zener diodes.
Figure 3:
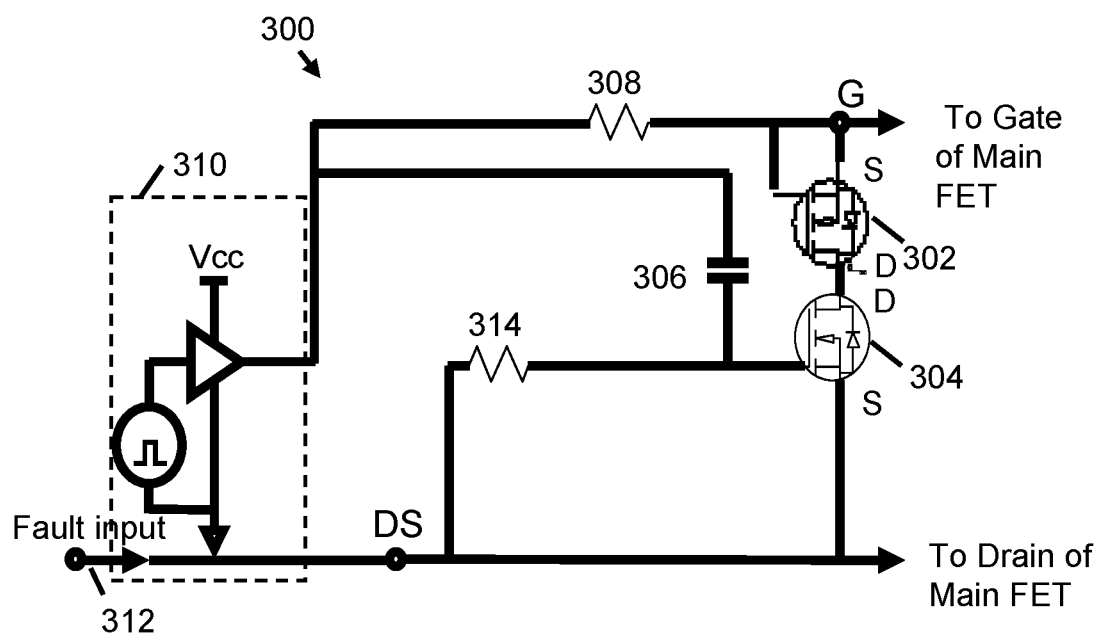
FIG. 3 is a circuit schematic of the gate protection circuit of the present invention.

FIG. 3 illustrates a first embodiment of the gate protection circuit of the present invention. Gate protection circuit 300 includes a blocking FET 302 and a discharge FET 304. FETs 302, 304 are GaN FETs in a preferred embodiment of the present invention. The drain of blocking FET 302 is connected to the drain of discharge FET 304. The source and the gate of FET 302 are connected to terminal G, which is connected to the gate of a main power FET (not shown), which is protected by the circuit. The source of the discharge FET 304 is connected to the drain of the main power FET, and the gate of the discharge FET 304 is connected to a capacitor 306 and to gate resistor 314.

Gate protection circuit 300 also includes a gate resistor 308 connected between a driver 310 and the gate of the main FET. Driver 310 generates a voltage equal to Vdd, the drain voltage for the main FET, plus an additional bias voltage, e.g., 5 V, as shown in FIG. 4.

The fault input is received at port 312 connected to the terminal DS, which is connected to the drain of the main FET and is also connected to discharge FET 304 via gate resistor 314.

Figure 4:
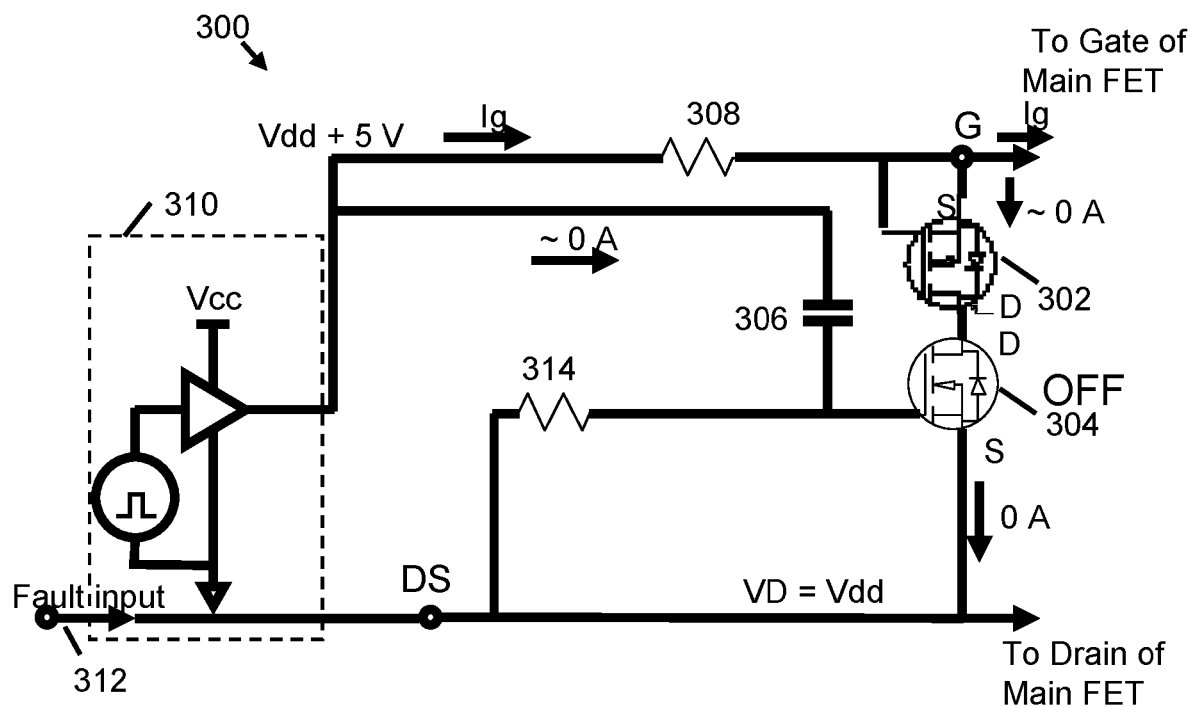
FIG. 4 illustrates the operation of the gate protection circuit of the present invention during the ON state of the main FET.

Referring now to FIG. 4, when the main FET is on during normal operating conditions (no fault), the circuit of the invention behaves as if the gate protection circuit 300 does not exist. More specifically, the voltage Vdd is connected to the drain of the main FET. Therefore, the drain/source terminal (DS) voltage of the main FET, VD, is equal to Vdd. As mentioned above, driver 310 generates a voltage equal to voltage Vdd plus a small bias voltage, e.g., 5 V. For example, if Vdd is 25 V, driver 310 may generate a voltage of 30 V. Thus, the present invention provides gate overvoltage protection for voltages up to at least 25 V, which is considerably higher than the typical 5 V or 6V gate voltage rating of a typical power GaN FET device.

The current Ig associated with the generated voltage is supplied to the gate of the main FET (via gate resistor 308). In these conditions, the current through the capacitor 306 will be approximately zero, and the discharge FET 304 is off, since the gate to source voltage is zero. When the discharge FET 304 is off, the main FET operates as if the gate protection does not exist, due to the zero current passing through discharge FET 304 and blocking FET 302.

Figure 5:
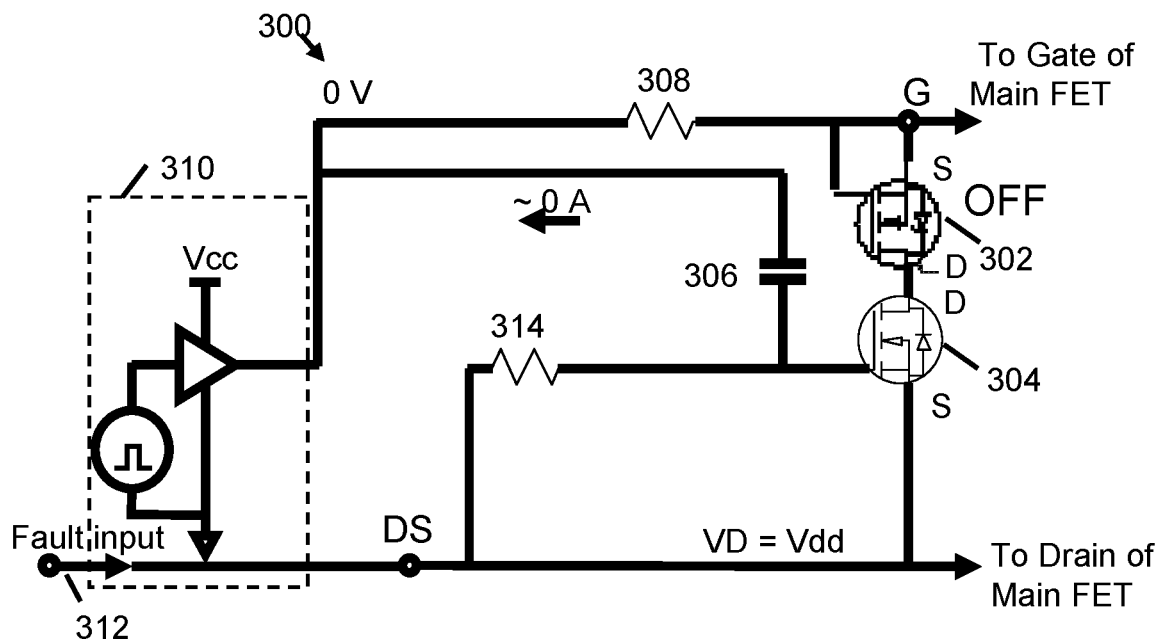
FIG. 5 illustrates the operation of the gate protection circuit of the present invention during the OFF state of the main FET.

Referring now to FIG. 5, when the main FET is off during normal operating conditions (no fault), the system will similarly behave as if the gate protection 300 does not exist. In the off state of the main FET, the voltage output supplied by driver 310 is 0 V, the main FET is off. It also turns off the blocking FET 302, and thereby preventing current from passing through blocking FET 302 and discharge FET 304.

Figure 6:
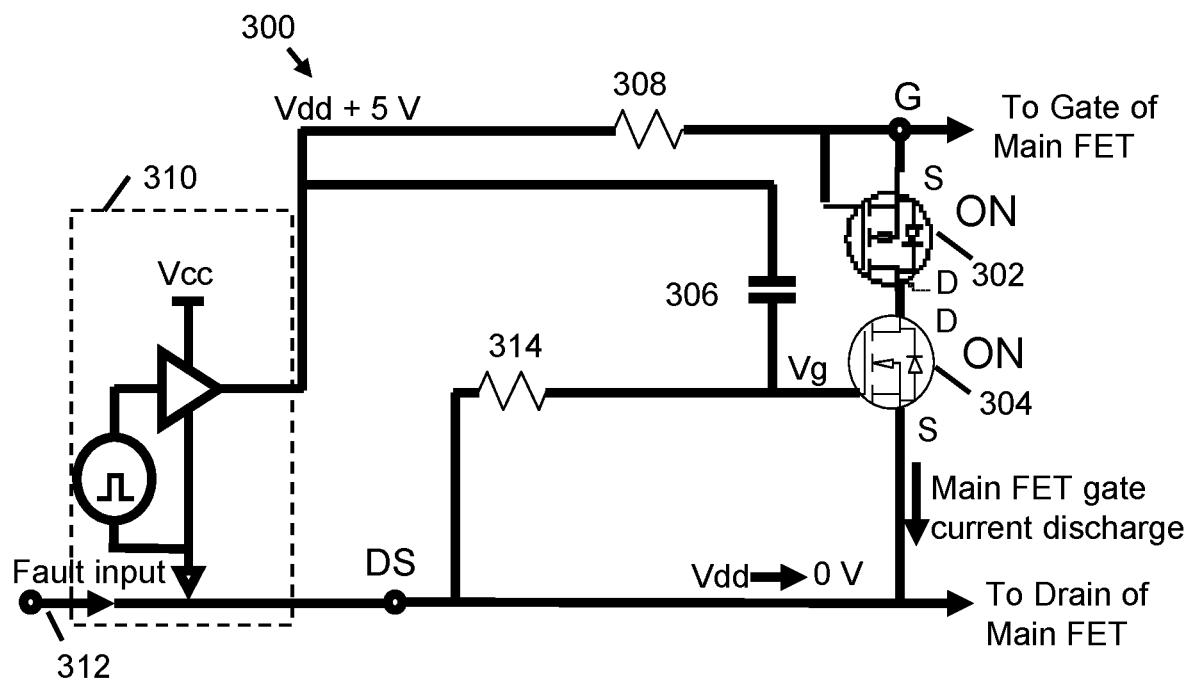
FIG. 6 illustrates the operation of the gate protection circuit of the present invention during an ON state fault condition of the main FET.

Referring now to FIG. 6, when a fault occurs during the on state of the main FET, the voltage at fault input port 312 shorts to zero, and the drain voltage of the main FET, VD, quickly drops to zero. A high gate-to-DS (drain/source) voltage stress (Vdd+5 volts) exists on the main FET, triggering the gate protection circuit 300 to function so that the gate-to-DS voltage of the main FET is quickly reduced. The gate protection circuit 300 operates in two steps. First, the voltage across the capacitor 306 remains about the same and hence the gate voltage of discharge FET 304 remains the same. But the source voltage of discharge FET (VD) has dropped to 0 V. Thus, the discharge FET 304, with a positive gate-to-source voltage, turns on. The relatively large discharge gate resistor 314 serves to hold the gate voltage Vg and slow the discharge of the gate voltage of FET 304.

After the discharge FET 304 turns on, the gate input capacitance of the main FET is quickly discharged through the blocking FET 302 and the discharge FET 304 (both of which are on), effectively lowering the voltage spike between the gate to DS terminal of the main FET, and thereby protecting the gate of the main FET.

Figure 7:
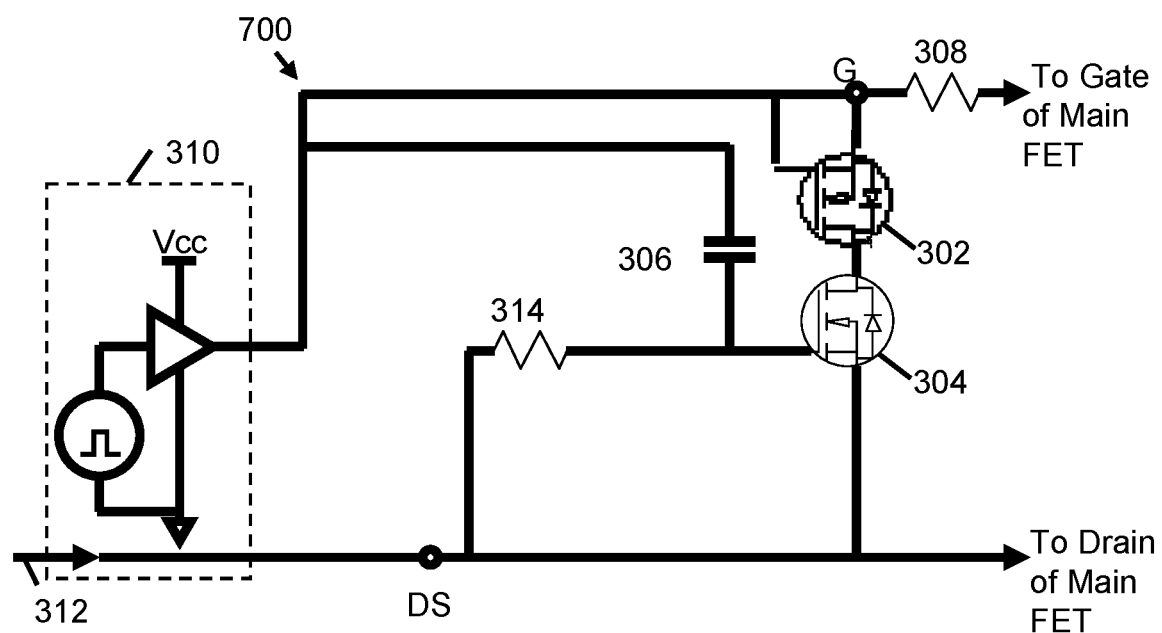
FIG. 7 illustrates a second embodiment of the gate protection circuit with the gate resistor for the main FET outside the circuit.

FIG. 7 illustrates a second embodiment of the gate protection circuit of the present invention. In gate overvoltage protection circuit 700, the gate resistor 308 is moved to a different location, i.e., between the source of the blocking FET 302 and the gate of the main FET. The advantage of this configuration is that any leakage current through the discharge FET 304 and blocking FET 302 does not increase the voltage drop across the gate resistor 308 which—in the configuration of FIG. 3—reduces the effective gate drive voltage for the main FET. Note that, in this configuration, the output of the driver 310 is assumed to have high output impedance such that the large discharge current from FETs 302 and 304 during the occurrence of a fault is capable to pull down the output of the driver 310.

Figure 8:
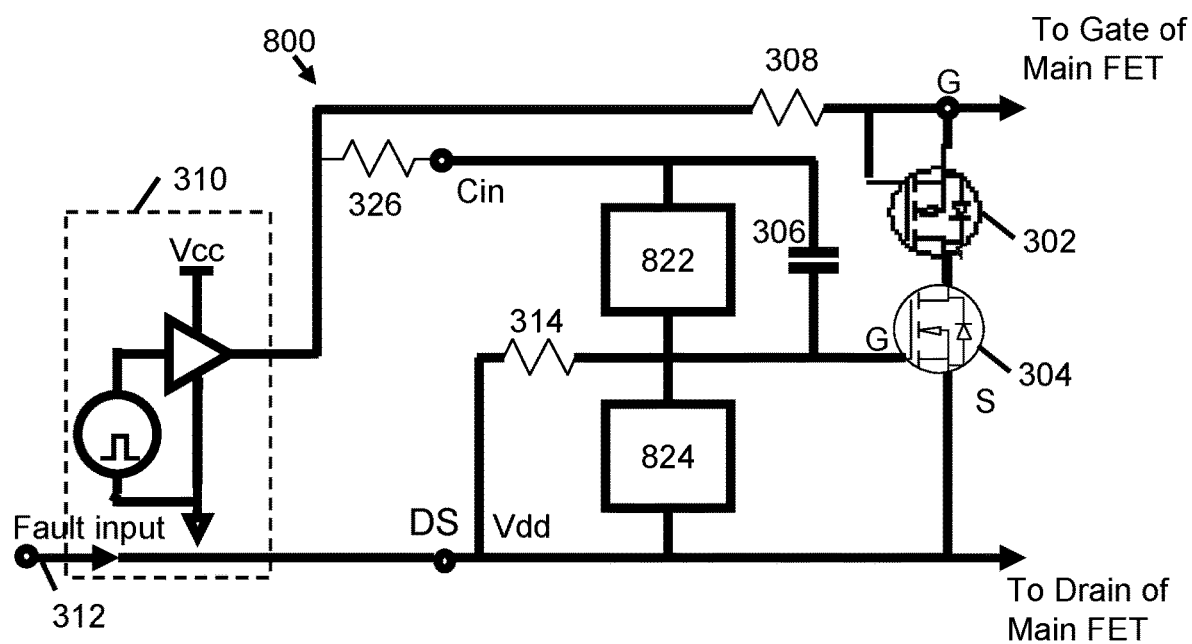
FIG. 8 illustrates a third embodiment of the gate protection circuit with voltage clamps.

FIG. 8 illustrates a gate overvoltage protection circuit 800 according to a third embodiment of the present invention, which includes two voltage clamps 822 and 824. Voltage clamp 822 limits the voltage across capacitor 306, since the capacitor may have a limited breakdown voltage. Voltage clamp 824 protects the gate-to-source voltage of discharge FET 304 from voltage overshoot and undershoot. Resistor 326 is an optional current-limiting resistor to limit the leakage current flowing through clamps 822 and 824.

Figure 9A:
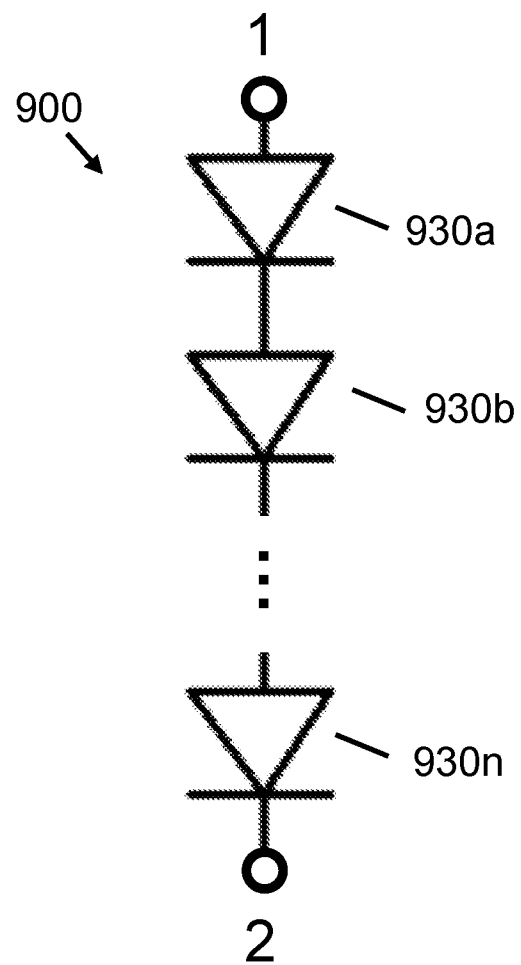
FIGS. 9A and 9B illustrate voltage clamp implementations.
Figure 9B:
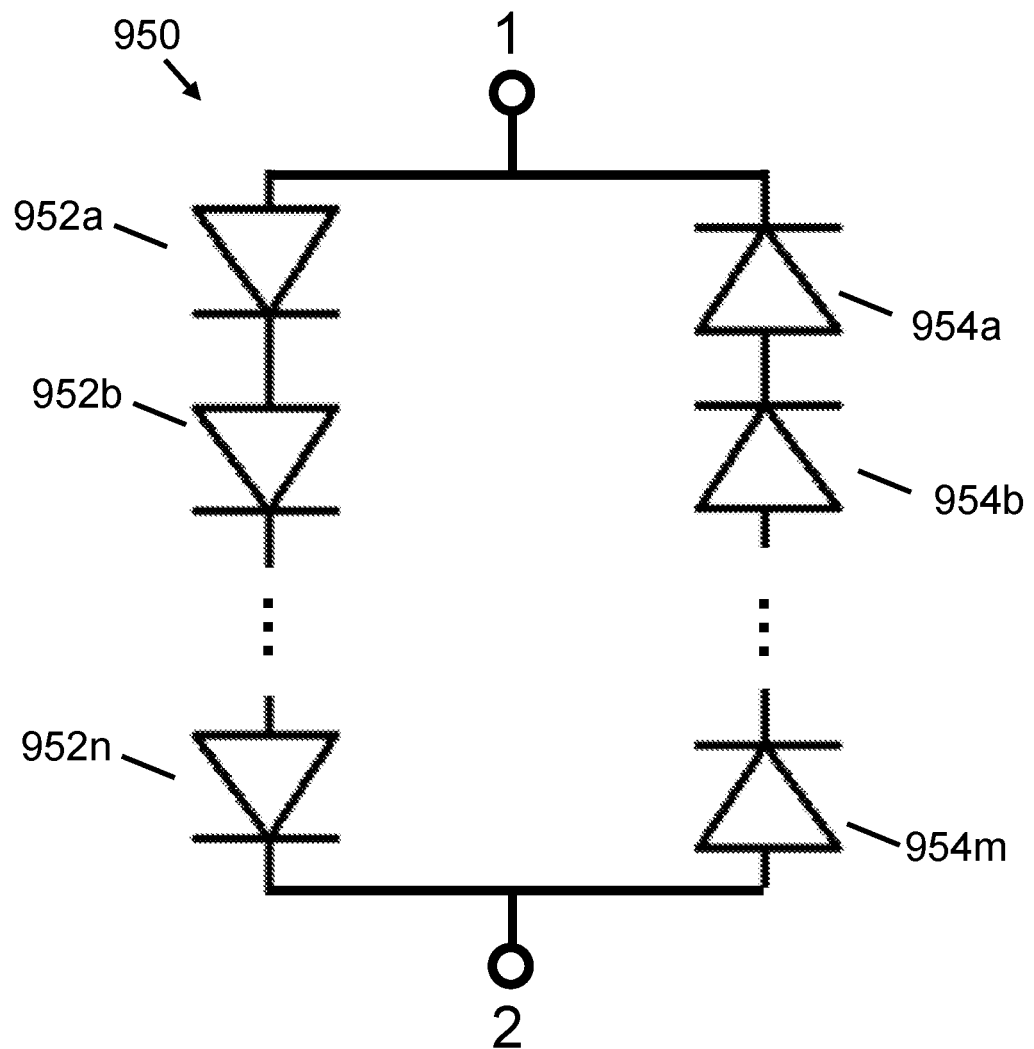

FIGS. 9A and 9B illustrate implementations of voltage clamps that can be used in the embodiment of FIG. 8. FIG. 9A illustrates a voltage clamp 900 that can be used for the first voltage clamp 822, where terminal 1 of the clamp 900 is connected to the gate drive output (with optional current limiting resistor 826), and terminal 2 is connected to the gate of the discharge FET 304.

Voltage clamp 900 includes one or more diodes 930a, 930b . . . 930n connected in series. The diodes 930a, 930b . . . 930n may be implemented as GaN Schottky diodes, source-to-gate connected GaN FETs, or combinations of both. The number of diodes n is determined by the forward voltage drop of the individual diodes and/or the threshold voltage of the GaN FETs in accordance with the breakdown voltage of capacitor 306.

FIG. 9B illustrates an implementation of second voltage clamp 824, where terminal 1 of clamp 950 is connected to the gate of the discharge FET 304 of FIG. 8, and terminal 2 is connected to the drain/source (DS) terminal of the main FET. Voltage clamp 950 of FIG. 9B includes two series-connected string of diodes 952, 954 connected in an anti-parallel configuration. The diodes of the two parallel series are oriented oppositely to provide a clamping function in both directions. As shown, the first series of diodes 952*a*, 952*b* . . . 952*n* includes n diodes orientated from terminal 1 to terminal 2, and the second series of diodes 954*a*, 954*b* . . . 954*m* include m diodes orientated from terminal 2 to terminal 1. As in FIG. 9A, the diodes may be GaN Schottky diodes, source-to-gate connected GaN FETS, or combinations thereof. The number of diodes n, m is determined by the forward voltage drop of the individual diodes and/or the threshold voltage of the series GaN FETs in accordance with the maximum gate-to-source voltage of the discharge FET 304.

Figure 10:
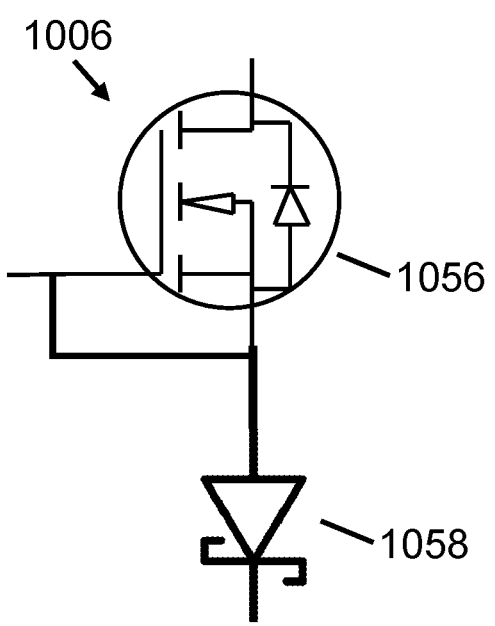
FIG. 10 illustrates an implementation of an integrated capacitor.

The implementation of capacitor 306 of the present invention is not limited to a passive metal-insulator-metal (MIM) structure. FIG. 10 illustrates an example of an alternative integrated circuit capacitor implementation consisting of a gate-to-source connected FET 1056 in series with a Schottky diode 1058. The gate-source connection serves as the bottom plate of the capacitor and the drain of FET 1056 serves as the top plate of the capacitor. Diode 1058 is optional. The purpose of including diode 1058, if included, is to prevent potential reverse current flow in the FET 1056 when the main FET is in the off state.

Figure 11:
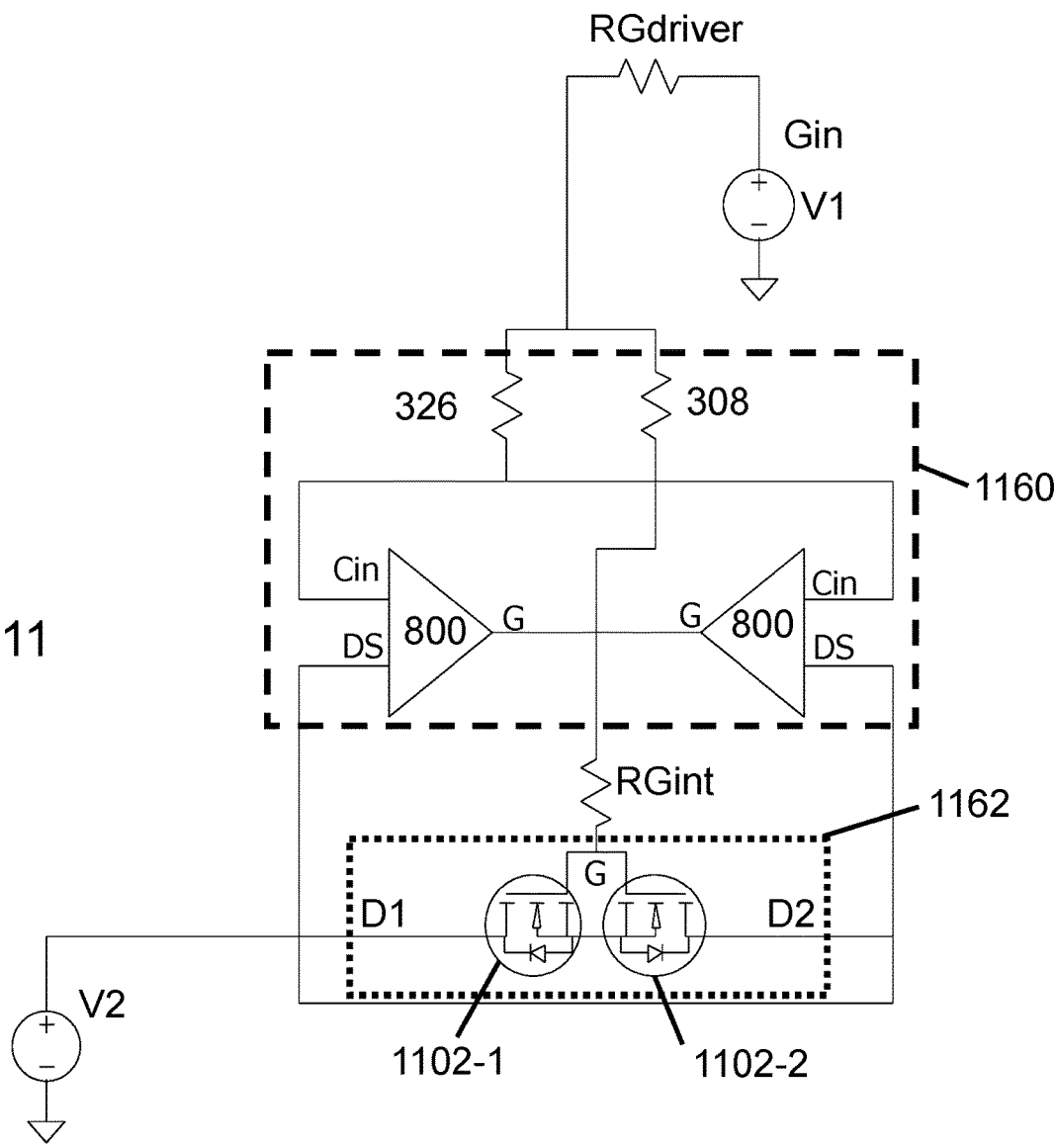
FIG. 11 illustrates a bidirectional GaN FET with integrated gate protection between the gate and the two drains of the bidirectional GaN FET.
Figure 12:
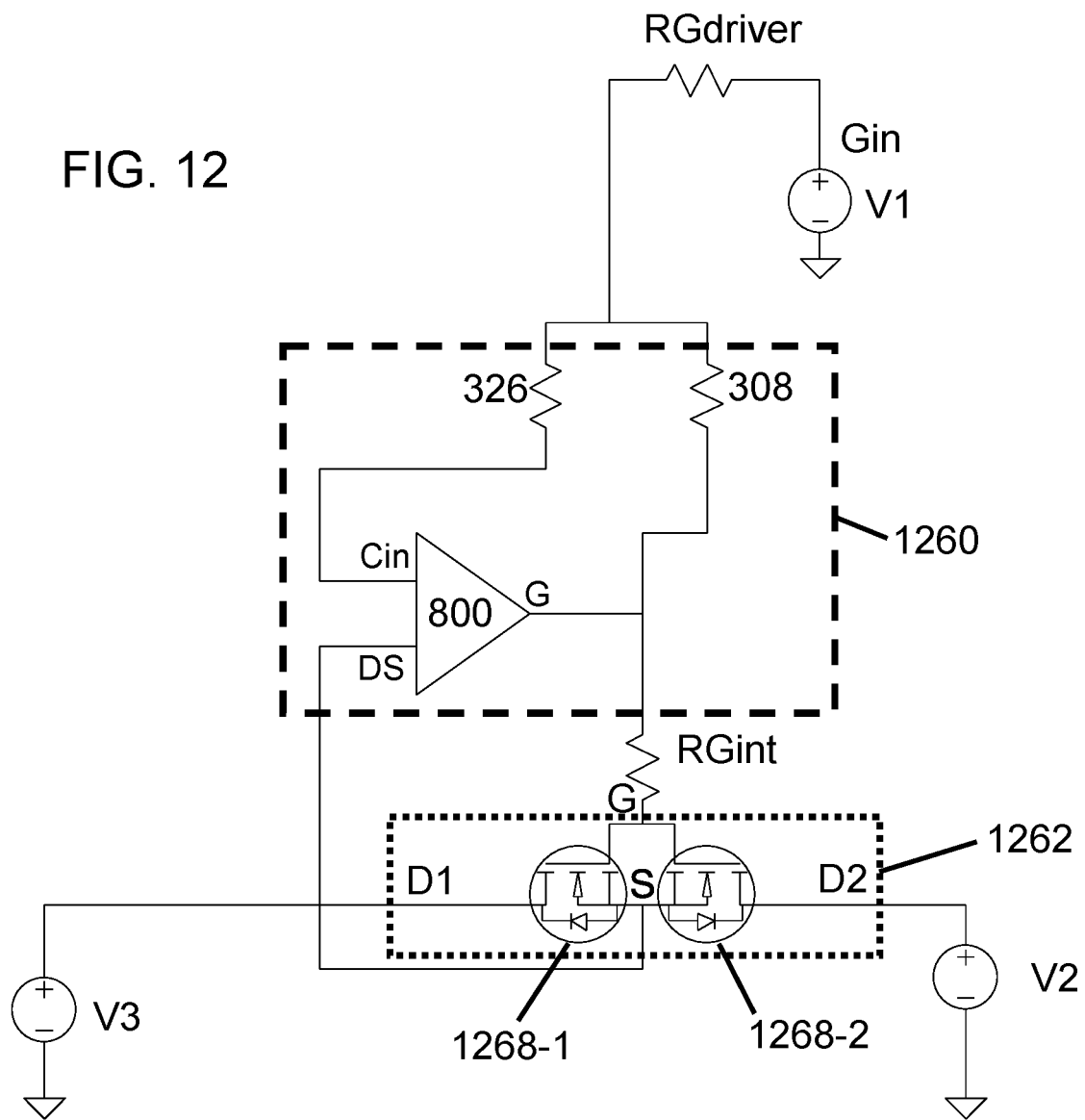
FIG. 12 illustrates a bidirectional GaN FET with integrated gate protection between the gate and source of the bidirectional GaN FET.
Figure 13:
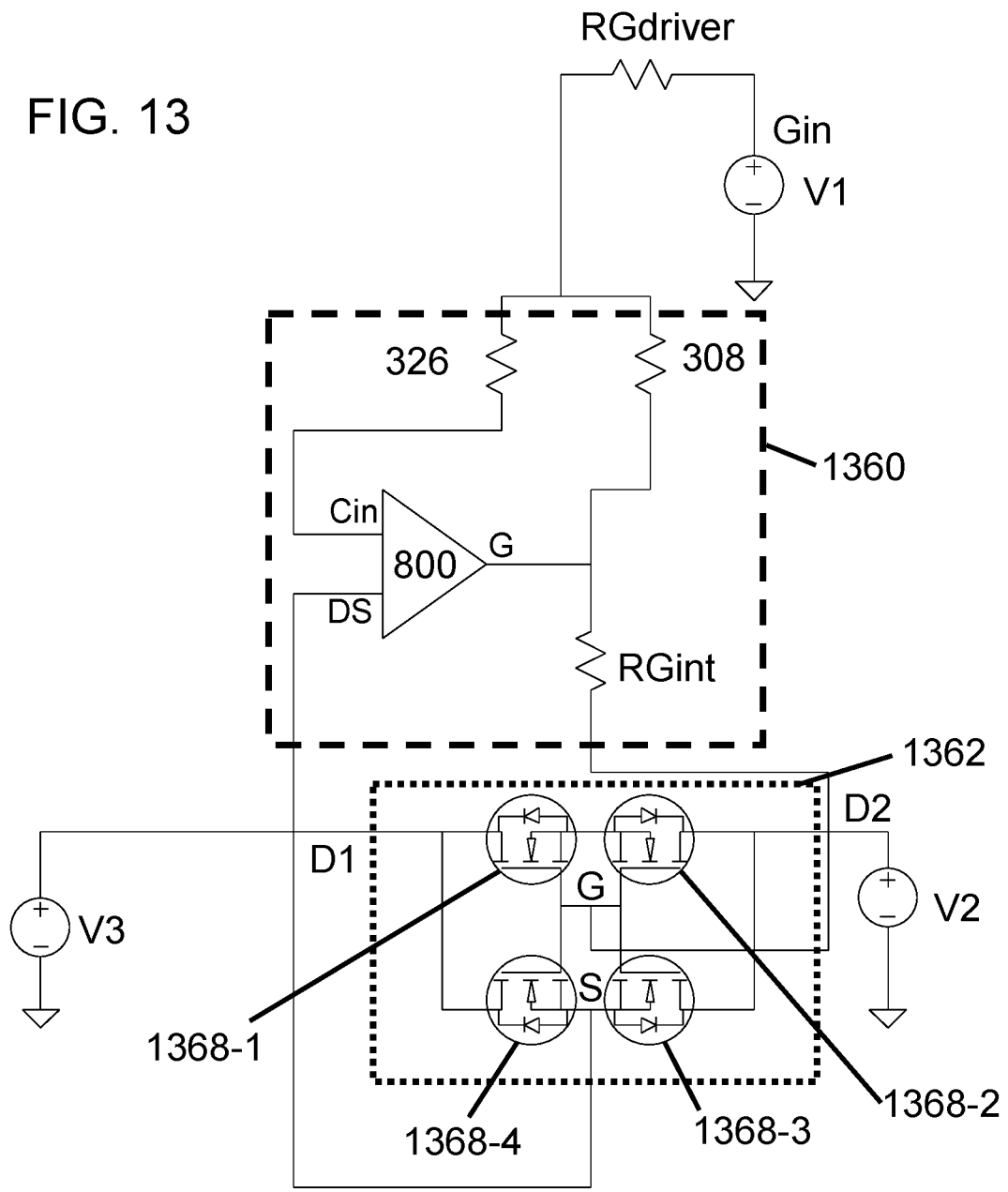
FIG. 13 illustrates a bidirectional GaN FET with two embedded back-to-back FETs with integrated gate protection between the gate and source of the bidirectional GaN FET.

FIGS. 11-13 provide examples of bidirectional GaN FETs provided with the integrated gate protection circuit of the present invention.

FIG. 11 shows a bidirectional GaN FET 1162 with integrated gate protection between the gate G and the two drains D1 and D2 of the back-to-back GaN FETs 1102-1 and 1102-2 of the bidirectional GaN FET. The integrated protection circuit 1160 includes a main gate protection building block 800 with terminals Cin, DS, and G, similar to those shown in FIG. 8.

FIG. 12 shows a bidirectional GaN FET 1262 with integrated gate protection between the gate G and the common source S of the back-to-back GaN FETs 1268-1 and 1268-2 of the bidirectional GaN FET. Again, the integrated protection circuit 1260 includes a main gate protection building block 800 with terminals Cin, DS, and G, similar to those shown in FIG. 8.

FIG. 13 shows a bidirectional GaN FET 1362 with integrated gate protection between the gate G and the source of two pairs of back-to-back GaN FETs 1368-1 and 1368-2, and 1368-3 and 1368-4 of the bidirectional GaN FET. Again, the integrated protection circuit 1360 includes a main gate protection building block 800 with terminals Cin, DS, and G, similar to those shown in FIG. 8.

In summary, the present invention, in the various embodiments described above, provides an integrated gate protection circuit that protects the gate of a power device from a voltage stress higher than the breakdown voltage of the gate. The present invention advantageously provides gate overvoltage protection up to at least 25 V, which is significantly higher than the gate voltage rating of 6 V or 7 V of typical GaN FET power devices.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A gate overvoltage protection circuit for protecting a main field effect transistor (FET) having a gate and a drain, comprising:
a first FET and a second FET connected between the gate and the drain of the main FET, wherein the first FET and the second FET each have a drain, a source and a gate, and wherein:
the drain of the first FET is connected to the drain of the second FET, and the source and the gate of the first FET are connected to the gate of the main FET; and
the source of the second FET is connected to the drain of the main FET, and the gate of the second FET is connected to a capacitor;
wherein the gate overvoltage protection circuit is configured to turn on both the first FET and the second FET in the event of a fault condition, such that charge from the gate of the main FET is discharged through the first FET and the second FET to the drain of the main FET, thereby protecting the gate of the main FET.

2. The circuit of claim 1, further comprising a driver for supplying a voltage equal to a voltage at the drain of the main FET plus a bias voltage, wherein the voltage supplied by the driver is applied to the gate of the main FET and to the capacitor.

3. The circuit of claim 1, wherein the voltage at the drain of the main FET is 25 V, and the bias voltage is 5 V.

4. The circuit of claim 1, further comprising a gate resistor connected to the gate of the second FET and to the capacitor, and connected to the drain of the main FET.

5. The circuit of claim 1, further comprises a gate resistor connected to the gate of the main FET.

6. The circuit of claim 1, further comprising a first voltage clamp connected in parallel with the capacitor.

7. The circuit of claim 6, wherein the first voltage clamp comprises a plurality of series-connected diodes or a plurality of series-connected gate-to-source connected FETs.

8. The circuit of claim 1, further comprising a second voltage clamp connected between the gate of the second FET and the drain of the main FET.

9. The circuit of claim 8, wherein the second voltage clamp comprises a plurality of series-connected diodes connected in an anti-parallel configuration or a plurality of series connected gate-to-source connected FETs connected in an anti-parallel configuration.

10. The circuit of claim 1, wherein the main FET and the first and second FETs are gallium nitride (GaN) FETs.

11. The circuit of claim 1, wherein the capacitor comprises a source-to-gate connected gallium nitride (GaN) FET.

12. The circuit of claim 11, wherein the source-to-gate connected GaN FET is connected in series with a diode.

13. The circuit of claim 1, wherein the main FET is a bidirectional FET.

14. The circuit of claim 13, wherein the bidirectional FET is a bidirectional GaN FET.

15. An integrated gate protection circuit, comprising:
a bidirectional field effect transistor (FET) having a gate and a drain; and
gate overvoltage protection circuit for protecting the bidirectional FET, comprising:
a first FET and a second FET connected between the gate and the drain of the bidirectional FET, wherein the first FET and the second FET each have a drain, a source and a gate, and wherein:

the drain of the first FET is connected to the drain of the second FET, and the source and the gate of the first FET are connected to the gate of the bidirectional FET; and the source of the second FET is connected to the drain of the bidirectional FET, and the gate of the second FET is connected to a capacitor;

wherein the gate overvoltage protection circuit is configured to turn on both the first FET and the second FET in the event of a fault condition, such that charge from the gate of the bidirectional FET is discharged through the first FET and the second FET to the drain of the bidirectional FET, thereby protecting the gate of the bidirectional FET.

* * * * *